(12) United States Patent
Jiang et al.

(10) Patent No.: US 10,770,525 B2
(45) Date of Patent: Sep. 8, 2020

(54) ORGANIC LIGHT-EMITTING DISPLAY PANEL, DISPLAY DEVICE, AND FABRICATION METHOD THEREOF

(71) Applicant: Shanghai Tianma Micro-Electronics Co., Ltd., Shanghai (CN)

(72) Inventors: Wenxin Jiang, Shanghai (CN); Jiaxin Li, Shanghai (CN); Guofeng Zhang, Shanghai (CN); Hua Gong, Shanghai (CN); Canjun Xiao, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 16/222,516

(22) Filed: Dec. 17, 2018

(65) Prior Publication Data
US 2020/0052050 A1 Feb. 13, 2020

(30) Foreign Application Priority Data
Aug. 10, 2018 (CN) .......................... 2018 1 0906976

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 51/5212* (2013.01); *H01L 51/5253* (2013.01); *H01L 51/56* (2013.01); *H01L 2227/323* (2013.01)

(58) Field of Classification Search
CPC .................................................. H01L 27/3246
See application file for complete search history.

(56) References Cited

U.S. PATENT DOCUMENTS

2016/0254274 A1* 9/2016 Li .......................... H01L 21/77
257/72

FOREIGN PATENT DOCUMENTS

| CN | 206282861 U | 6/2017 |
| CN | 207116481 U | 3/2018 |

* cited by examiner

*Primary Examiner* — Yu-Hsi D Sun
(74) *Attorney, Agent, or Firm* — Anova Law Group PLLC (57) ABSTRACT

An organic light-emitting display panel, divided into a display region and a non-display region surrounding the display region, includes a substrate; an array layer formed over the substrate; a pixel defining layer formed on the surface of the array layer away from the substrate; and a plurality of organic light-emitting devices formed in a plurality of openings of the pixel defining layer. The plurality of organic light-emitting devices are disposed in the display region, and each organic light-emitting device includes an anode, an organic light-emitting layer, and a cathode sequentially formed on the substrate. The organic light-emitting display panel also includes a plurality of support units disposed in the non-display region. At least one support unit of the plurality of support units is disposed on the surface of the pixel defining layer away from the substrate.

14 Claims, 9 Drawing Sheets

ORGANIC LIGHT-EMITTING DISPLAY PANEL, DISPLAY DEVICE, AND FABRICATION METHOD THEREOF

CROSS-REFERENCES TO RELATED APPLICATIONS

This application claims the priority of Chinese patent application No. 201810906976.3, filed on Aug. 10, 2018, the entirety of which is incorporated herein by reference.

FIELD OF THE DISCLOSURE

The present disclosure generally relates to the field of display technology and, more particularly, relates to organic light-emitting display panel, display device, and fabrication method thereof.

BACKGROUND

With the development of display technology, the display panel manufacturing technology has also become more and more mature. The existing display panels mainly include organic light-emitting diode (OLED) display panels and liquid crystal display (LCD) panels. The OLED display panels have been widely used in the display field due to its advantages of self-luminescence, low power consumption, fast response speed, wide viewing angle, etc.

However, OLED display panels are very sensitive to oxygen and moisture. If oxygen and moisture permeate into the interior of an OLED display panel, undesirable phenomena such as black spots, pinholes, and chemical reaction of organic materials may take place, thereby affecting the service life of the OLED display panel. In order to prevent external moisture, oxygen and other impurities from invading into the interior of the OLED display panel and resulting in reduction in the lifetime due to oxidation of the devices inside the OLED display panel, the OLED display panel usually adopts a thin film encapsulation (TFE) method to package the OLED display devices. However, with the improvement of the existing technology, even after the package structure of the organic light-emitting display panel is improved, paths for water and oxygen may still exist. As such, the OLED display devices may fail and dark spots may be created.

Therefore, providing an organic light-emitting display panel that is capable of improving the package performance and the product yield has become a technical issue to be solved in the field of display technology. The disclosed organic light-emitting display panel, display device, and fabrication method are directed to solve one or more problems set forth above and other problems in the art.

BRIEF SUMMARY OF THE DISCLOSURE

One aspect of the present disclosure provides an organic light-emitting display panel. The organic light-emitting display panel, divided into a display region and a non-display region surrounding the display region, includes a substrate; an array layer formed over the substrate; a pixel defining layer formed on the surface of the array layer away from the substrate; and a plurality of organic light-emitting devices formed in a plurality of openings of the pixel defining layer. The plurality of organic light-emitting devices are disposed in the display region, and each organic light-emitting device includes an anode, an organic light-emitting layer, and a cathode sequentially formed on the substrate in a direction away from the substrate. The organic light-emitting display panel also includes a plurality of support units disposed in the non-display region. At least one support unit of the plurality of support units is disposed on the surface of the pixel defining layer away from the substrate.

Another aspect of the present disclosure provides an organic light-emitting display device. The display device includes an organic light-emitting display panel according to the present disclosure.

Another aspect of the present disclosure provides a method for fabricating an organic light-emitting display panel including a display region and a non-display region surrounding the display region. The method includes providing a substrate; forming an array layer on the surface of the substrate; and forming a pixel defining layer on the surface of the array layer away from the substrate and a plurality of organic light-emitting devices in the display regions. Each organic light-emitting device includes an anode, an organic light-emitting layer, and a cathode. Forming the pixel defining layer and the plurality of organic light-emitting devices further includes sequentially forming the anode, the pixel defining layer, the organic light-emitting layer, and the cathode in a direction away from the substrate; and after forming the pixel defining layer and prior to forming the organic light-emitting layer, forming a plurality of support units in the non-display region on the surface of the pixel defining layer away from the substrate.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to various exemplary embodiments of the present disclosure, which are illustrated in the accompanying drawings. It should be noted that specific details are set forth in the following description in order to provide a thorough understanding of the present disclosure. However, the present disclosure can be implemented in various ways other than those described herein, and those skilled in the art can make similar modification without departing from the spirit of the present disclosure. Therefore, the present disclosure should not be limited by the specific embodiments disclosed below.

The terms used in the embodiments of the present disclosure are merely for the purpose of describing particular embodiments, and are not intended to limit the present disclosure. The singular forms such as "a", "the", and "such a" used in the embodiments of the present disclosure and the appended claims are also intended to include the plural cases unless the context clearly indicates other meanings.

It should be noted that the terms such as "upper", "lower", "left", "right", etc. described in the embodiments of the present disclosure are used based on the view angle of the drawing, and thus should not be interpreted as limitations of the embodiments of the present disclosure. In addition, it should also be noted that when an element is referred to as "on" or "under" another element in the context, the element may be directly disposed "on" or "under" the other element, or may be indirectly disposed "on" or "under" the other element with an intermediate element in between.

In order to make the above described objects, features and advantages of the present disclosure more apparent and easy to understand, the present disclosure will now be further described with reference to the accompanying drawings and various embodiments. However, the exemplary embodiments can be implemented in a variety of forms and should not be construed as being limited to the specific embodiments set forth herein; instead, these embodiments are provided to make the present disclosure more comprehensive and complete, such that the concepts of the exemplary embodiments can be fully provided to those skilled in the art. The same reference numbers in the drawings refer to the same or similar structures, and thus once a reference number is described in a figure, description of the number will not be repeated in subsequent figures. The words expressing the position and the orientation in the present invention are described by taking the drawings as an example. However, changes can be made according to actual needs, and such changes are also included in the scope of the present disclosure. The drawings of the present disclosure are only used to illustrate the relative positional relationship, and the layer thicknesses of some portions may be drawn in an exaggerated manner in order to be easily understood. The layer thickness in the drawings does not represent the exact proportional relationship of the actual layer thickness. In the case where no conflict is involved, the embodiments in the present disclosure and the features in the embodiments can be combined with each other. The same labels are used in the drawings of the various embodiments of the present disclosure. In addition, the similarities between different embodiments may not be described again.

The packaging performance of traditional organic light-emitting display panels may be undesired. For example, unexpected objects may appear on the display panel. Further, these unexpected objects are found to appear at the edges of the display region. In particular, these unexpected objects are located at positions near the openings of a common mask plate, which is used for evaporating the organic material layers of the organic light-emitting diodes in the display panel.

Figure 1:
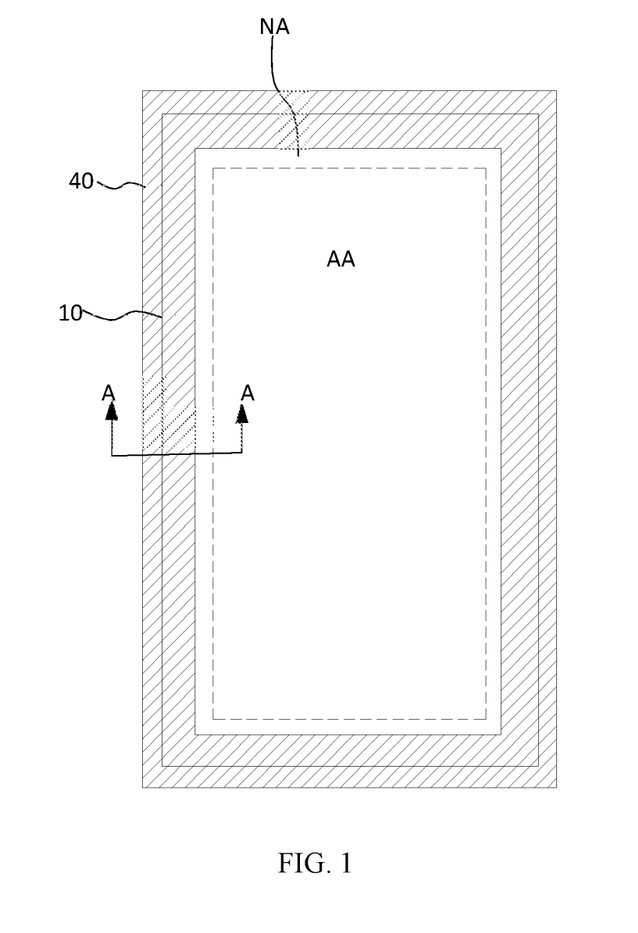
FIG. 1 illustrates a schematic diagram of an organic light-emitting display panel.
Figure 2:
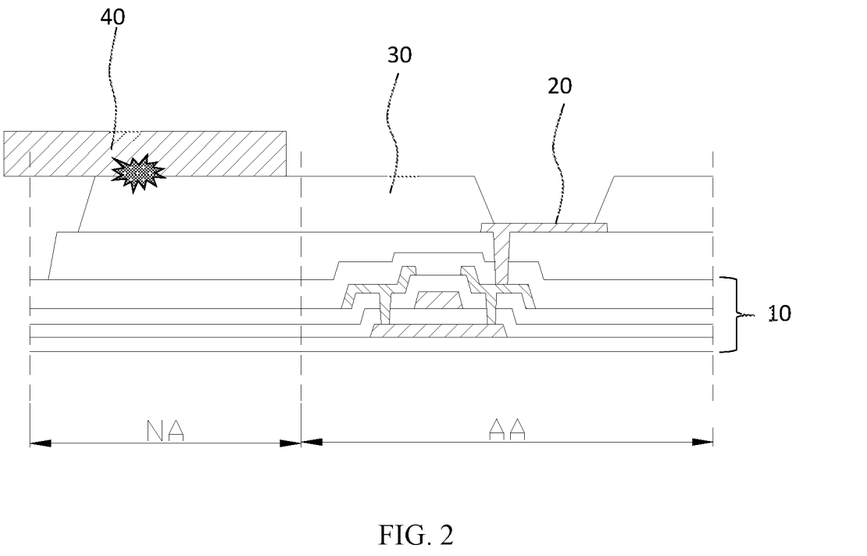
FIG. 2 illustrates a schematic cross-sectional view of the organic light-emitting display panel shown in FIG. 1 in a direction along an A-A line.

FIG. 1 illustrates a schematic diagram of an organic light-emitting display panel fabricated using a method according to the existing technology, and FIG. 2 illustrates a schematic cross-sectional view of the organic light-emitting display panel shown in FIG. 1 in a direction along an A-A line. Referring to FIGS. 1-2, in the existing technology, in order to fabricate an organic light-emitting display panel, a traditional evaporation process is used to form the organic light-emitting material. That is, a common mask plate is used during the evaporation of the organic light-emitting material for the OLED. Although the organic light-emitting material can be patterned using the common mask plate, during the actual manufacturing process, due to the structural characteristics of the common mask plate, the non-display region plays a major role in supporting the mask plate, and the mask plate may cause damage to the film layer in the non-display region during the pressing process (i.e., the process to press the mask plate against the supporting non-display region), generating scratches on the substrate or the display panel. The scratches are located within the non-display region, and the packaging layer needs to be in contact with the substrate or other layers on the substrate in the non-display region to package the OLED. Therefore, in the existing technology, after the subsequent TFE, the scratches may affect the performance of the contact between the packaging layer and the substrate or other layers on the substrate, causing the display panel to form paths for water and oxygen. As such, the OLED display devices may fail and dark spots may be generated.

Figure 3:
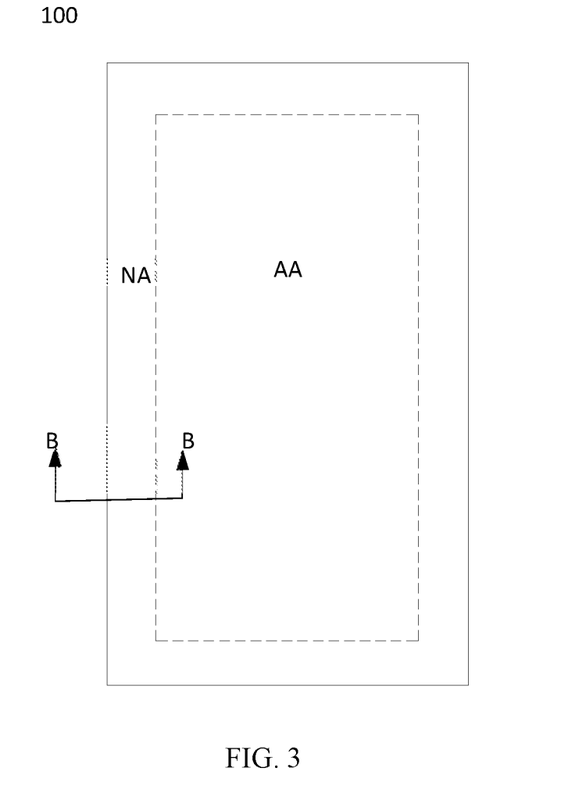
FIG. 3 illustrates a schematic diagram of an exemplary organic light-emitting display panel according to some embodiments of the present disclosure.

The present disclosure provides an organic light-emitting display panel. FIG. 3 illustrates a schematic diagram of an exemplary organic light-emitting display panel according to some embodiments of the present disclosure, and FIG. 4 illustrates an exemplary schematic cross-sectional view of the organic light-emitting display panel shown in FIG. 3 in a direction along a B-B line.

Figure 4:
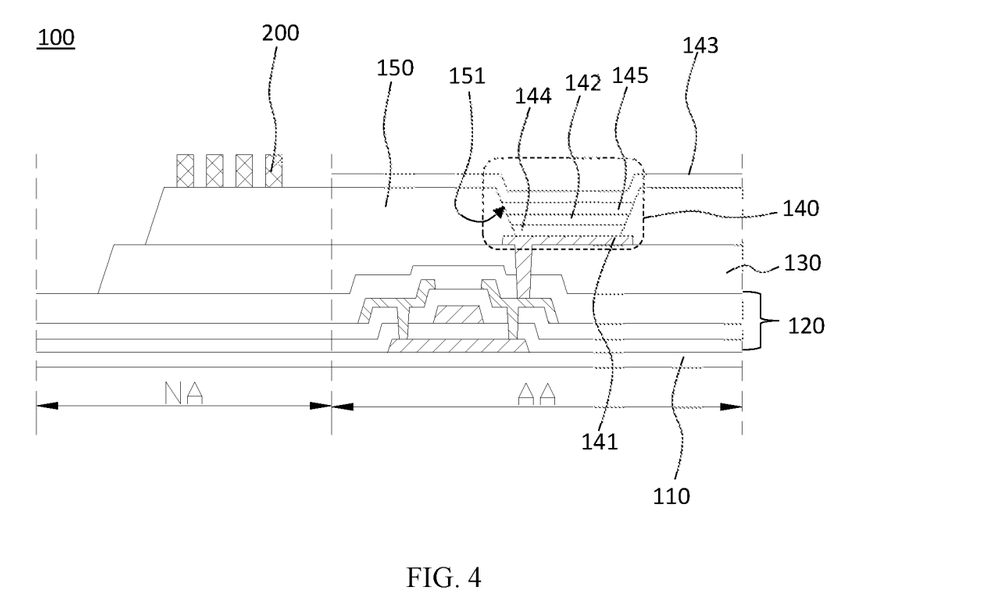
FIG. 4 illustrates an exemplary schematic cross-sectional view of the organic light-emitting display panel shown in FIG. 3 in a direction along a B-B line.

Referring to FIGS. 3-4, the organic light-emitting display panel 100 may be divided into a display region AA and a non-display region NA surrounding the display region AA. The organic light-emitting display panel 100 may include a substrate 110, an array layer 120 disposed on the substrate 110, a pixel defining layer 150 formed on the surface of the array layer 120 away from the substrate 110, and a plurality of organic light-emitting devices 140 defined by a plurality of openings 151 formed in the pixel defining layer 150. The plurality of organic light-emitting devices 140 may be located within the display region AA. For illustration purposes, only one organic light-emitting device 140 is shown in each figure as an example to describe the structure of the disclosed organic light-emitting display panel.

In one embodiment, the substrate 110 may be made of, for example, glass, polyimide (PI), polycarbonate (PC), polyethersulfone (PES), polyethylene terephthalate (PET), polyethylene naphthalate (PEN), polyarylate (PAR), glass fiber reinforced plastic (FRP), and other appropriate polymer materials. The substrate 110 may be transparent, translucent, or opaque. The substrate 110 in the embodiments of the present disclosure may be a flexible substrate made of a thin layer of a polymer, e.g. polyimide. The substrate 110 may also include a buffer layer. The buffer layer may include a stack structure formed by multiple inorganic and organic layers to block oxygen and moisture, preventing moisture or impurities from diffusing through the substrate. The buffer layer may also provide a flat surface on the upper surface of the substrate. The specific structure of the substrate is known to those skilled in the art, and will not be described in detail in the present disclosure.

The array layer 120 may include a plurality of thin film transistors (TFTs), and a pixel circuit formed by the TFTs to control the plurality of organic light-emitting devices 140. In the embodiments of the present disclosure, a top gate type TFT is taken as an example for the illustration of the structures. The array layer 120 may include an active layer used for forming the TFTs. The active layer may include a plurality of source regions, a plurality of drain regions, and a plurality of channel regions. The plurality of source regions and the plurality of drain regions may be formed by doping N-type impurity ions or P-type impurity ions, and each channel region may be formed between a source region and a drain region. The array layer 120 may also include a gate insulating layer formed on the active layer, and a plurality of gate electrodes of the TFTs formed on the gate insulating layer. The array layer 120 may also include an interlayer insulating layer formed on the plurality of gat electrodes, and the interlayer insulating layer may be formed by an inorganic insulating layer made of silicon oxide, silicon nitride, or any other appropriate inorganic insulator. In other embodiments, the interlayer insulating layer may be formed by an organic insulating layer. A plurality of source electrodes and a plurality of drain electrodes of the TFTs may be disposed on the interlayer insulating layer. The plurality of source electrodes and the plurality of drain electrodes may be electrically connected (or bonded) to the plurality of source regions and the plurality of drain regions, respectively through a plurality of contract holes. The plurality of contact holes may be formed by selectively removing a portion of the gate insulating layer and the interlayer insulating layer.

In one embodiment, the array layer 120 may further include a passivation layer formed on the plurality of TFTs. For example, the passivation layer may be disposed on the plurality of source electrodes and the plurality of drain electrodes. The passivation layer may be formed by an inorganic layer made of silicon oxide, silicon nitride, or any other appropriate inorganic material. In other embodiments, the passivation layer may be formed by an organic layer.

In one embodiment, the organic light-emitting display panel 100 may also include a planarization layer 130 formed on the array layer 120. The planarization layer may include an organic layer made of at least one of arcyl, PI, benzocyclobutene (BCB), or any other appropriate organic material. The planarization layer 130 may be able to provide a flat surface.

The organic light-emitting device 140 defined by the pixel defining layer 150 and the corresponding opening 151 formed in the pixel defining layer 150 may be formed on the planarization layer 130. For example, in a direction away from the substrate 110, the organic light-emitting device 140 may sequentially include an anode 141, an organic light-emitting layer 142, and a cathode 143. The anode 141 may include an anode pattern exclusively corresponding to a pixel unit. That is, the anode pattern and the pixel unit may have one-to-one correspondence. The anode pattern in the anode 141 may be electrically connected to a source electrode or a drain electrode of a TFT through a via formed in the planarization layer 130.

The pixel defining layer 150 is disposed over a surface of the anode 141 away from the array layer 120. The pixel defining layer 150 may be made of an organic material including at least one of PI, polyamide, BCB, acrylic resin, phenolic resin, etc. Alternatively, the pixel defining layer 150 may be made of an inorganic material including $SiN_x$, etc.

In one embodiment, the pixel defining layer 150 may include a plurality of openings 151 exposing the plurality of anodes 141. The pixel defining layer 150 may cover an edge portion of the pattern of each anode 141. The organic light-emitting layer 142 may be at least partially filled in each opening 151 and may be in contact with the anode 141 exposed in the opening 151. The organic light-emitting layer 142 in each opening 151 may form a smallest light-emitting unit. The light-emitting units may be able to emit light in different colors according to the organic light-emitting materials used, and each light-emitting unit may communicate with the pixel circuit to form a pixel, and a plurality of pixels may operate together to display pictures.

In one embodiment, the organic light-emitting layer 142 may be formed in the plurality of openings 151 of the pixel defining layer 150 through inkjet printing, nozzle printing, evaporation, or any other appropriate method. The cathode 143 may be formed on the organic light-emitting layer 142 through evaporation. In one embodiment, the cathode 143 may cover the organic light-emitting layer 142 and the pixel defining layer 150.

In one embodiment, a hole transport layer 144 and an electron transport layer 145 may be disposed in the organic light-emitting display panel 100. The hole transport layer 144 may be disposed on the surface of the anode 141 away from the substrate 110. The organic light-emitting layer 142 may be disposed on the surface of the hole transport layer 144 away from the anode 141. The electron transport layer 145 may be disposed on the surface of the organic light-emitting layer 142 away from the hole transport layer 144. Therefore, the hole transport layer 144 may be located between the anode 141 and the organic light-emitting layer 142. The hole transport layer 144 may be used to enhance the ability of the anode 141 in injecting and transporting holes to the organic light-emitting layer 142. The electron transport layer 145 may be located between the organic light-emitting layer 142 and the cathode 143, and may be used to enhance the ability of the cathode 143 in injecting and transporting electrons to the organic light-emitting layer 142. As such, a large number of holes and electrons can be injected into the organic light-emitting layer 142. Therefore, the recombination efficiency may be improved, and the improvement of the luminous efficiency of the organic light-emitting layer 142 may also be achieved.

In one embodiment, the organic light-emitting display panel may further include a hole injection layer (not shown) and an electron injection layer (not shown). The hole injection layer may be disposed on the surface of the hole transport layer away from the organic light-emitting layer. That is, the hole injection layer may be located between the anode and the hole transport layer. The electron injection layer may be disposed on the surface of the electron transport layer away from the organic light-emitting layer. That is, the electron injection layer may be located between the cathode and the electron transport layer.

The organic light-emitting display panel 100 may further include a plurality of support units 200 disposed in the non-display region NA. At least one support unit 200 of the support units 200 may be formed on the surface of the pixel defining layer 150 away from the substrate 110. For example, the support units 200 may be formed on the pixel defining layer 150 and may be directly in contact with the pixel defining layer 150. That is, according to the fabrication sequence, the film layer of the support units 200 may be located between the pixel defining layer 150 and the hole transport layer 144. In one embodiment, the plurality of support units 200 may be discretely arranged on the pixel defining layer 150, and the adjacent support units 200 may be spaced from each other.

In one embodiment, the plurality of support units 200 may be made of an organic material, including at least one of PI, polyamide, BCB, acrylic resin, phenolic resin, polystyrene resin, etc. Therefore, the support unit 200 may have certain flexibility, such that while ensuring the support units providing sufficient support for the film layers, the cushioning performance may also be improved.

In one embodiment, in a path from the edge of the display region AA to the edge of the organic light-emitting display panel 100, at least two support units 200 may be disposed.

In one embodiment, the path from the edge of the display region AA to the edge of the organic light-emitting display panel 100 may be consistent with the moving direction of the common mask plate.

In one embodiment, in the moving direction of the common mask plate, the heights of at least two support units 200 may be consistent with each other. By providing at least two support units with a same height in the moving direction of the common mask plate, the mask plate can be stably supported, preventing the mask plate from tilting. At the same time, the possibility of scratching the support units can be reduced, and the situation of the support units becoming detached can be avoided. As such, the yield may be further improved.

In one embodiment, the minimum distance from one support unit 200 to the edge of the display region AA, i.e., the shortest straight-line distance from one single support unit 200 to the edge of the display region AA, may be in a range of approximately 50 µm to 150 µm, for example, including about 50 µm, about 150 µm, or any value between 50 µm and 150 µm. As used herein, a range disclosed in the present specification encompasses the values of the two endpoints of the range.

Considering the structure of the panel and the result of the evaporation process, the edge of the common film layer evaporated using the common mask plate may be located within the non-display region, and the result of the evaporation process may be optimized when the distance between the edge of the common film layer and the edge of the display region (referring to the minimum straight-line distance from any point on the edge of the common film layer to the edge of the display region) is approximately 100 µm. Further, considering that the alignment error of the common mask plate is approximately 50 µm, the distance from the support unit 200 to the edge of the display region AA may be in a range of approximately 50 µm to 100 µm.

Further, because the common mask plate may be a structure formed by a hollow region of the display region and a frame region surrounding the hollow region. In one embodiment, the distance from any support unit 200 to the edge of the display region AA may be in a range of approximately 50 µm to 100 µm. Therefore, in the case where misalignment causes the frame of the mask plate to exceed the edge position of the preset common film layer and shift away from the display region, the hollow region of the mask plate may expose the support units and the support units may not affect the hollow region that exceeds the pattern edge of the preset common film layer. In the case where misalignment causes the frame of the mask plate to exceed the edge position of the preset common film layer and shift towards the display region, the support units may provide support for the frame that exceeds the pattern edge of the preset common film layer. At the same time, the support units may not be too close to the display region. Therefore, the support units may not affect the display region. For example, the packaging of the display region, the flatness of the film layer, etc. may not be affected.

It should be understood that the embodiments of the present disclosure are described by taking cylindrical support units as examples for illustration; however, in other alternative embodiments of the present disclosure, the plurality of support units may have any other appropriate shapes. For example, the plurality of support units may be protrusions, hemispheres, plateaus, etc.

In one embodiment, the disclosed organic light-emitting display panel may also include a packaging layer (i.e., a thin-film packaging layer, not shown). The packaging layer may be disposed on the surfaces of the plurality of organic light-emitting devices (i.e., the light-emitting functional layer) away from the array layer 120. The packaging layer may fully cover the plurality of organic light-emitting devices 140, and thus may be used for packaging the plurality of organic light-emitting devices 140. For example, the packaging layer may be disposed on the cathode, and may sequentially include a first inorganic packing layer, a first organic packing layer, and a second inorganic packaging layer in a direction away from the substrate 110. In other embodiments, the packaging layer may have a multi-layer structure including alternately stacked at least one organic material layer and at least two inorganic material layers. In addition, two inorganic material layers may be formed as the top layer and the bottom layer of the multi-layer structure, respectively.

According to the embodiment of the present disclosure, a plurality of support units are disposed on the pixel defining layer in the non-display region. During the evaporation process of the common film layers, the plurality of support units may provide support for the mask plate, and thus reduce the contact area between the display panel and the mask plate. As such, the contact area between other film layers (i.e., the film layers that have been formed on the display panel prior to the evaporation process) on the display panel and the mask plate may be reduced, and thus the mask plate may be prevented from scratching the other film layers. Therefore, introducing invasion paths for water and oxygen may be avoided. In addition, the plurality of support units may also reduce the friction between the mask plate and the display panel, further preventing the mask plate from scratching the film layers, and thus improving the product yield.

Figure 5:
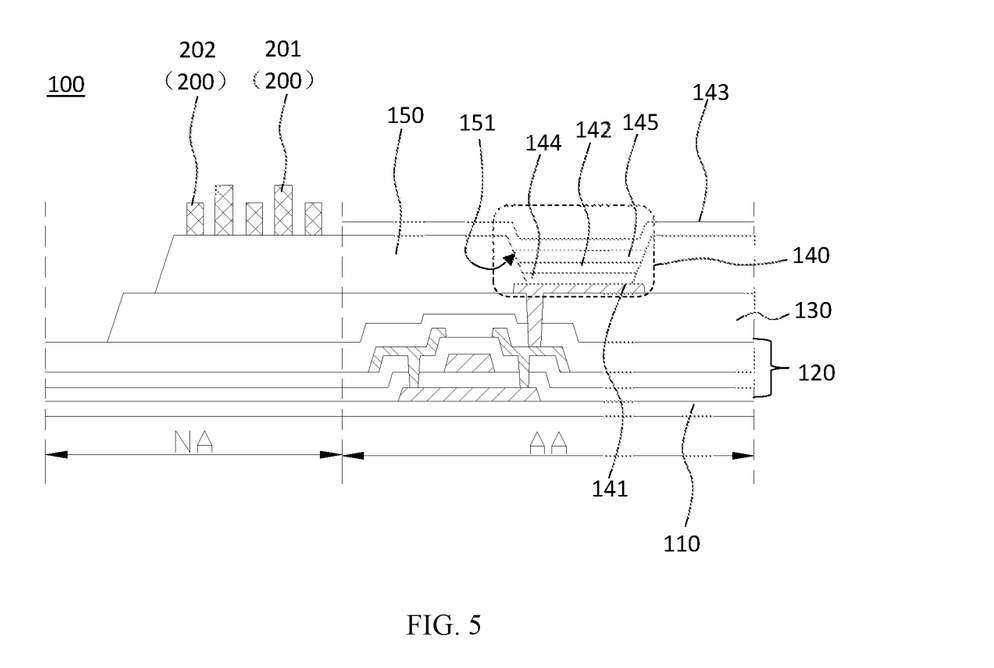
FIG. 5 illustrates another exemplary schematic cross-sectional view of the organic light-emitting display panel shown in FIG. 3 in the direction along the B-B line.

FIG. 5 illustrates another exemplary schematic cross-sectional view of the organic light-emitting display panel shown in FIG. 3 in the direction along the B-B line. Referring to FIG. 5, in another embodiment, the organic light-emitting display panel may be substantially the same as the organic light-emitting display panel show in FIG. 4, and the similarities will not be described herein again. However, the plurality of support units 200 discretely arranged on the pixel defining layer 150 in the organic light-emitting display panel shown in FIG. 5 may include a plurality of third support units 201 and a plurality of fourth support units 202. In a direction perpendicular to the substrate 110, the height of the plurality of third support units 201 may be larger than the height of the plurality of fourth support units 202.

Therefore, by setting the plurality of third support units 201 higher than the plurality of fourth support units 202, the plurality of third support units 201 may play the major role in supporting the mask plate. Therefore, the contact area and the friction between the mask plate and the film layers of the display panel may be reduced, such that the possibility of generating scratches may also be reduced. In the meantime, because of the presence of the plurality of fourth support units 202 which are shorter than the third support units 201, the plurality of fourth support units 202 may play a supporting role in supporting the display panel. For example, even when the pressure or friction that the mask plate applies to the plurality of third support units 201 is too large such that the plurality of third support units 201 appear to be detached, or be bent or deformed, the plurality of fourth support units 202 may participate to provide support for the mask plate. As such, friction between the mask plate and the pixel defining layer 150 may still be avoided, which may improve the reliability of the support that the plurality of support units 200 provide for the mask plate. Therefore, a double insurance effect may be achieved.

In one embodiment, along a linear path from the edge of the display region AA to the edge of the display panel (that is, in a direction along the B-B line), the organic light-emitting display panel may at least include a plurality of third support units 201 and a plurality of fourth support units 202. Further, along the linear path, the plurality of third support units 201 and the plurality of fourth support units 202 may be alternately distributed, and the height of the third support units 201 may be different from the height of the fourth support units 202.

In one embodiment, at least one third support unit 201 may be disposed adjacent to at least one fourth support unit 202. For example, the plurality of support units 200 may include a plurality of third support units 201 arranged in an array and a plurality of fourth support units 202 arranged in another array. The array of the plurality of third support units 201 may be intercalated with the array of the plurality of fourth support units 202, and thus the array of the third support units 201 and the array of the fourth support units 202 may together form a total array of the support units 200. In the total array of the support units 200, the plurality of third support units 201 may be distributed uniformly and the plurality of fourth support units 202 may also be distributed uniformly. As such, the uniformity of the support provided by the plurality of support units 200 may be improved, preventing the mask plate from tilting.

Figure 6:
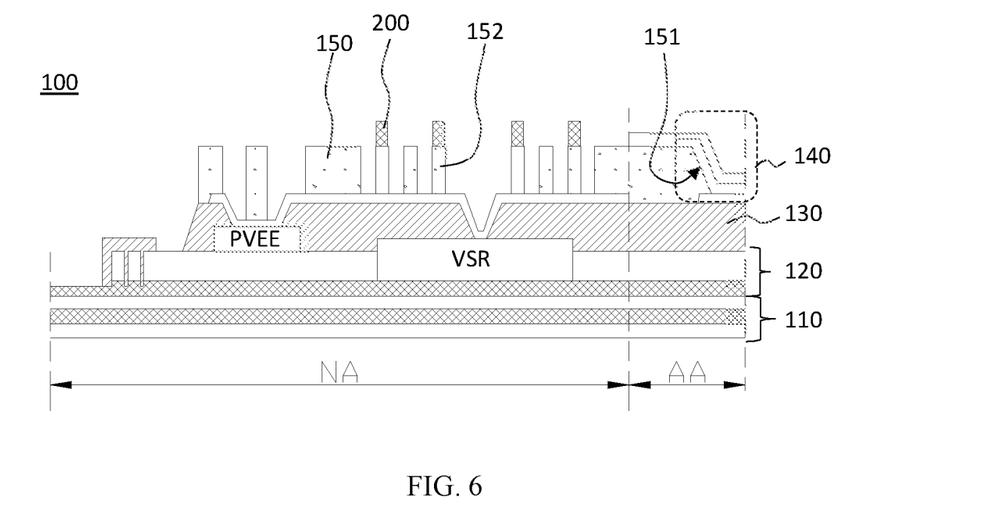
FIG. 6 illustrates another exemplary schematic cross-sectional view of the organic light-emitting display panel shown in FIG. 3 in the direction along the B-B line.
Figure 7:
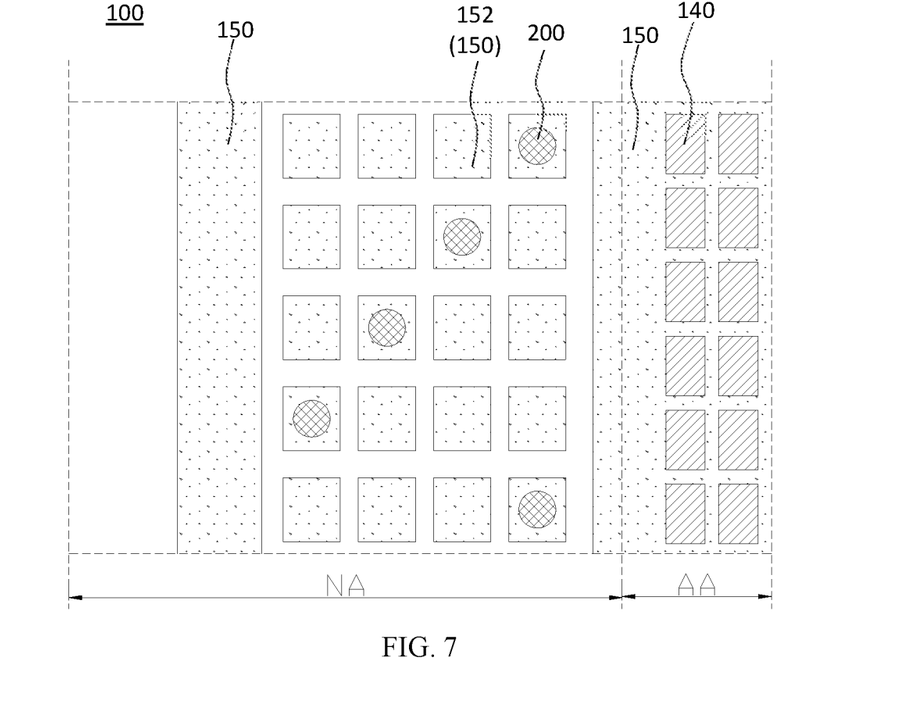
FIG. 7 illustrates a schematic cross-sectional view of another exemplary touch-control panel consistent with some embodiments of the present disclosure.

FIG. 6 illustrates another exemplary schematic cross-sectional view of the organic light-emitting display panel shown in FIG. 3 in the direction along the B-B line, and FIG. 7 illustrates a schematic cross-sectional view of another exemplary touch-control panel consistent with some embodiments of the present disclosure. In another embodiment, referring to FIGS. 6-7, the organic light-emitting display panel may be substantially the same as the organic light-emitting display panels described above, and the similarities between the organic light-emitting display panels will not be described herein again. However, in the non-display region NA, the pixel defining layer 150 may include a plurality of island structures 152 that are isolated from each other, and at least some of the support units 200 may be disposed on the plurality of island structures 150. It should be noted that plurality of island structures 152 may be formed by patterning a portion of the pixel defining layer 150 into islands. The plurality of island structures 152 may be formed through wet etching, dry etching, or photolithography. The plurality of island structures 152 may be formed in a same patterning process as the plurality of openings 151 of the pixel defining layer 150.

In one embodiment, the non-display region NA may include a first non-display region (not shown) and a second non-display region (not shown). The first non-display region may surround the display region AA, the second non-display region may surround the display region AA and the first non-display region.

In the non-display region NA, the pixel defining layer 150 may be divided into a first portion located within the first non-display region and a second portion located within the second non-display region. In the first non-display region, the pixel defining layer 150 may include a plurality of island structures 152 with the plurality of island structures 152 spaced apart from each other. The plurality of island structures 152 may be disposed to surround the display region AA. In the second display region, the pixel defining layer 150 may have a ring pattern surrounding the display region AA and the first non-display region.

In one embodiment, the plurality of island structures 152 may be spaced apart from each other to expose other film layers under the pixel defining layer 150, for example, a planarization layer disposed between the array layer 120 and the pixel defining layer 150 may be exposed.

In one embodiment, the plurality of island structures 152 may be distributed uniformly. For example, the plurality of island structures 152 may be arranged into an array.

In one embodiment, in the path from the edge of the display region AA to the edge of the display panel, at least two island structures 152 may be disposed. In one embodiment, the direction of the path may be consistent with the moving direction of the common mask plate. In addition, in the moving direction of the common mask plate, the at least two island structures 152 may have a same height.

By arranging at least two island structures in the moving direction of the mask plate and disposing a plurality of support units on the island structures, the mask plate may be stably supported to avoid tilting of the mask plate. In the meantime, the possibility of scratching the supporting units may be reduced, and the situation of the support units becoming detached can be avoided. As such, the yield may be further improved.

In one embodiment, the quantity of the support units 200 may be smaller than the quantity of the island structures 152.

In one embodiment, the quantity of the support units disposed on each island structure may not exceed one. In other embodiments, the support units and the island structures may have one-to-one correspondence according to actual needs, or a plurality of support units may be disposed on a single island structure.

According to the embodiment of the present disclosure, a plurality of support units are disposed on a plurality of island structures formed on the pixel defining layer. The plurality of island structures may be spaced apart from each other. The contact area between the mask plate and the display panel may be reduced and the friction between the mask plate and the display panel may also be reduced. As such, scratches on the display panel may be avoided. In addition, the mask plate may be supported by the plurality of support units, such that the mask plate may apply an excessively large pressure onto the plurality of support units. The plurality of support units may be further supported by the pixel defining layer. The pixel defining layer, different from a retaining wall which needs to form a continuous ring structure to surround the display region and thus seal the packaging layer from all directions, can be patterned into a plurality of island structures. Therefore, when the plurality of support units apply an excessively large pressure onto the pixel defining layer located under the plurality of support units, and thus lead to cracks in the pixel defining layer, the spacing between the island structures may be able to interrupt the cracks, preventing the cracks from spreading into other regions. In particular, the spacing between the island structures may be able to prevent the cracks from spreading into the display region and thus affecting the display and the organic light-emitting device or forming invasion paths for water and oxygen. Moreover, even when the plurality of support units receive an excessively large pressure or friction from the mask plate and appear to be damaged or detached, the spacing between the plurality of island structures may be able to contain the unexpected objects came from the falling-off support units.

Figure 8:
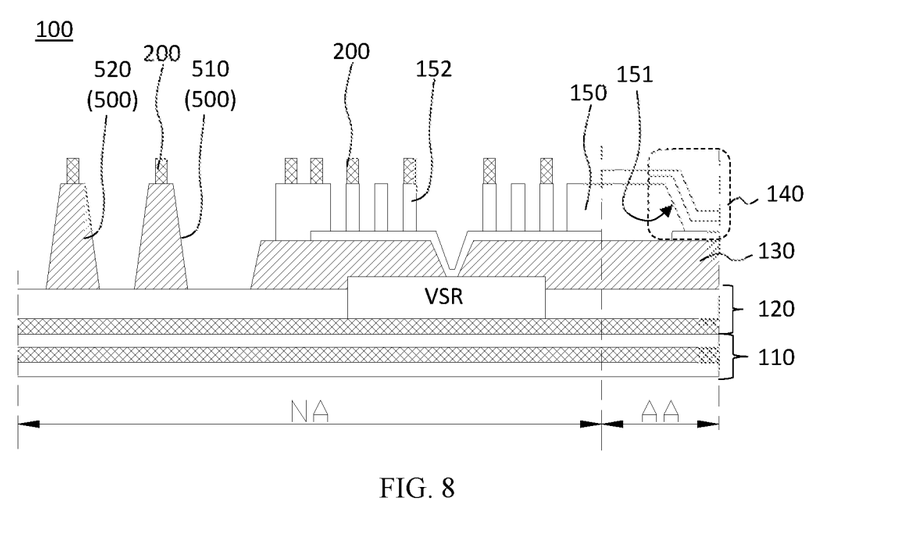
FIG. 8 illustrates another exemplary schematic cross-sectional view of the organic light-emitting display panel shown in FIG. 3 in the direction along the B-B line.

FIG. 8 illustrates another exemplary schematic cross-sectional view of the organic light-emitting display panel shown in FIG. 3 in the direction along the B-B line. Referring to FIG. 8, in one embodiment, the organic light-emitting display panel 100 may further include a retaining wall 500 disposed in the non-display region NA. The retaining wall 500 may be formed on the surface of the array layer 120 away from the substrate 110, and may surround the display region AA.

In one embodiment, the array layer 120 may include a passivation layer formed between the plurality of TFTs (located within the array layer 120) and the planarization layer 130. The retaining wall 500 may be disposed on the passivation layer. For example, the retaining wall 500 may be located between the passivation layer and the packaging layer. The orthogonal projection of the retaining wall on the substrate 110 may surround the planarization layer. That is, the edge of the orthogonal projection of the planarization layer 130 on the substrate 110 may be located on the surface of the retaining wall 500 that is close to the display region AA.

In one embodiment, the retaining wall 500 may include a first surrounding wall 510 and a second surrounding wall 520. The first surrounding wall 510 may be disposed to surround the display region AA, and the second surrounding wall 520 may be spaced apart from the first surrounding wall 510 and may surround the first surrounding wall 510. The packaging layer may cover the first surrounding wall 510, and may be located within the region surrounded by the second surrounding wall 520. The first organic packaging layer may be located within the region surrounded by the first surrounding wall 510. The first surrounding wall may be able to prevent overflow of the organic material in the packaging layer.

In one embodiment, the retaining wall may be separately fabricated using a material with a certain hardness and containing carbon, nitrogen, oxygen, etc. For example, the retaining wall may be made of a heterocyclic polymer containing imino groups and benzene rings, a polyether amide, etc.

In other embodiments, the retaining wall according to the present disclosure may not be limited to only including two surrounding walls, the quantity of the surrounding walls included in the retaining wall may be determined according to the actual needs. In other embodiments, the surrounding walls according to the present disclosure may not be separately fabricated; instead, the surrounding walls may be formed by patterning a material in a same layer as the planarization layer or the pixel defining layer. In one embodiment, the surrounding walls may have a multi-layer structure and the quantity of the film layers in the surrounding walls may be changed according to actual needs. The first surrounding wall and the second surrounding wall may have the same structure and composition. In other embodiments, the first surrounding wall and the second surrounding wall may have different structures and different compositions.

In one embodiment, at least one support unit 200 of the support units 200 may be formed on the surface of the retaining wall 500 away from the substrate 110.

It should be noted that although the material in the same layer as the pixel defining layer may be multiplexed as the retaining wall, the desired result of the present disclosure cannot be achieved solely relying on the retaining wall or any additional structure disposed on the retaining wall. The retaining wall is a ring strip surrounding the display region, and thus even when support structures are disposed on the retaining wall, the support structures can only be located within the range of the ring strip. In addition, in order to achieve a narrow border, the width of the retaining wall should be minimized, which may not be conducive to the support for the mask plate. Moreover, the narrow retaining wall and the alignment error of the mask plate may easily cause that the mask plate is not supported accurately. Further, because the major role of the retaining wall is to cut off the packaging layer and block cracks, even when multiple rounds of the retaining wall are formed without considering the narrow boarder issue, different rounds of the retaining wall may be set to have different heights according to the actual requirements. In a case where the multiple rounds of the retaining wall have different heights, the mask plate can only be in contact with the highest round of the retaining wall or the support units disposed on the highest round of the retaining wall. Therefore, the stability and reliability of the support may be low, which may increase the risk of problems during the fabrication process. Moreover, because the mask plate is supported by the support units, the mask plate may apply a large pressure on the support units. In addition, different from the retaining wall which needs to form a continuous ring to surround the display region and thus seal the packaging layer from all directions, the pixel defining layer can be patterned into a plurality of island structures. The design of the island structures in combination with the support units may have functions as described above.

The following description further explains the reason to have some support units disposed on the retaining wall while the other support units disposed on the pixel defining layer. Disposing at least one support unit of the support units on the retaining wall may enhance the reliability of the support that the support units provide to the mask plate. That is, the distribution density of the support units may not be too high (excessively dense support units may increase the process difficulty), and in the meantime, the area size of the mask plate that is supported may be increased. Moreover, by arranging the plurality of support units, the mask plate may be prevented from tilting, and the collision or friction between the mask plate and the retaining wall may also be avoided. Therefore, the completion of the retaining wall may be ensured, which may be conducive to improving the reliability of the package.

Figure 9:
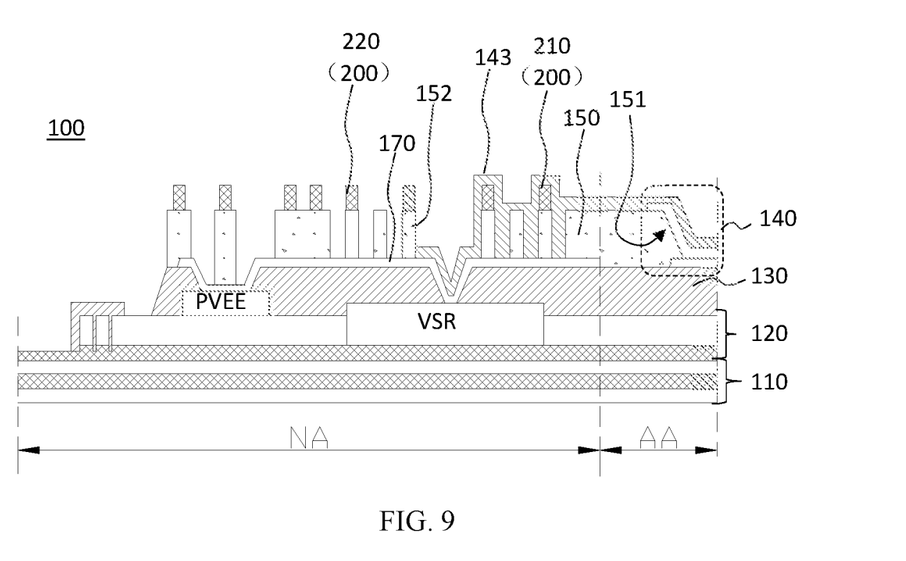
FIG. 9 illustrates another exemplary schematic cross-sectional view of the organic light-emitting display panel shown in FIG. 3 in the direction along the B-B line.

FIG. 9 illustrates another exemplary schematic cross-sectional view of the organic light-emitting display panel shown in FIG. 3 in the direction along the B-B line. Referring to FIG. 9, in one embodiment, the plurality of island structures 152 may be spaced apart from each other. The spacing between adjacent island structures 152 may expose other film layers under the pixel defining layer 150.

In one embodiment, the organic light-emitting display panel may also include an auxiliary conductive layer 170 located within the non-display region NA. The auxiliary conductive layer 170 may be in a same layer as the anode 141. The cathode 143 may be in contact with the anode 141 through the spacing between adjacent island structures 152. It should be noted that the auxiliary conductive layer 170 may be connected to a peripheral driving circuit of the display panel, e.g. a shift register, or may be connected to a low voltage signal source. The auxiliary conductive layer 170 may be used to transmit signals to the cathode, and thus may connect the cathode and the signal source and serve as a connection bridge. In addition, the auxiliary conductive layer 170 may be disposed in a same layer as the anode 141, so that forming an additional film layer to connect the cathode and the signal source may not be necessary. Therefore, the thickness of the film layers may be reduced, which may be conducive to making the display panel thinner.

In one embodiment, the plurality of support units 200 may include a plurality of first support units 210 and a plurality of second support units 220. The first support unit 210 may be located within a region covered by the orthogonal projection of the cathode 143 on the substrate 110. The second support unit 220 may be located outside of the region covered by the orthogonal projection of the cathode 143 on the substrate 110.

In one embodiment, the cathode 143 may have a single-piece structure and may cover the organic light-emitting layer 142, the pixel defining layer 150, and the array layer 120.

In one embodiment, the cathode may be formed on the organic light-emitting layer through an evaporation process. The mask plate used for evaporating the cathode (in the following, denoted by cathode mask plate) may have a frame structure similar to a door frame. For example, the cathode mask plate may include a hollow region exposing the display region and a frame region. When evaporating the cathode, the frame region of the cathode mask plate may need to be supported by the non-display region of the display panel. Therefore, the cathode mask plate may also face the issue of generating scratches on the display panel. Further, the hollow region of the cathode mask plate may be larger than the hollow region of the common mask plate, that is, the size of the region covered by the cathode may be larger than the size of the region covered by the film layer formed by evaporating through the common mask plate. Therefore, the cathode may cover the film layer formed by evaporating through the common mask plate. According to the embodiments of the present disclosure, while preventing the common mask plate from scratching the display panel, the disclosed organic light-emitting display panel may also ensure the cathode mask plate unable to scratch the display panel during the subsequent process for forming the cathode.

Figure 10:
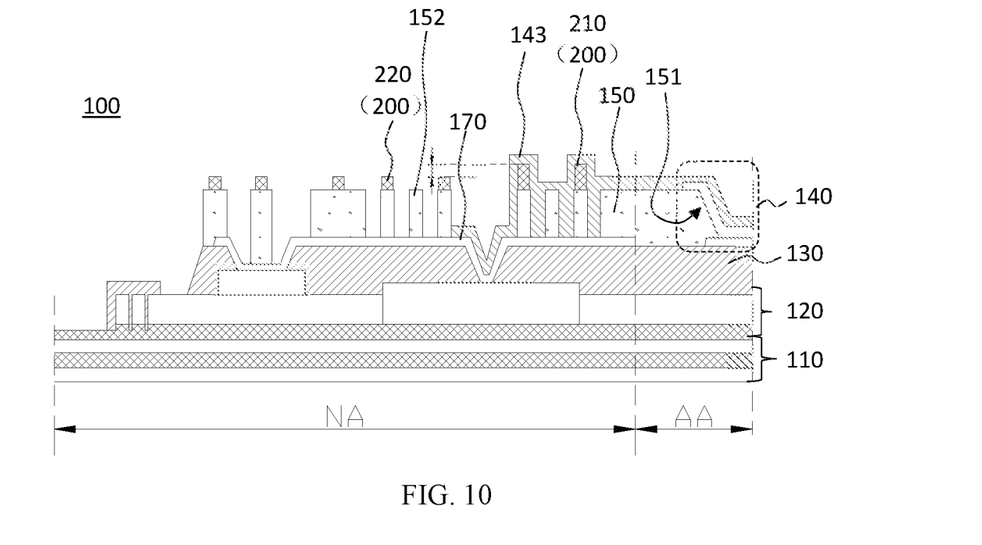
FIG. 10 illustrates another exemplary schematic cross-sectional view of the organic light-emitting display panel shown in FIG. 3 in the direction along the B-B line.

FIG. 10 illustrates another exemplary schematic cross-sectional view of the organic light-emitting display panel shown in FIG. 3 in the direction along the B-B line. Referring to FIG. 10, in the direction perpendicular to the substrate 110, the height of the plurality of second supports 220 may be smaller than the height of the plurality of first support units 210.

In one embodiment, the plurality of second support units 220 may be disposed in a region covered by the packing layer.

Compared with the plurality of first support units 210, the plurality of second support units 220 may be closer to the edge of the display panel and the retaining wall. That is, the plurality of second support units 220 may be closer to the edge of the packaging layer. Moreover, the thickness of the organic packaging layer may become thinner when approaching the edge of the packaging layer. Therefore, when the height of the support units (i.e., the plurality of second support units 220) is too large, the support units may not only penetrate through the packaging layer, but also raise the height of the packaging layer, such that the retaining wall may not be efficiently seal the packaging layer. In one embodiment, setting the height of the plurality of second support units 220 smaller than the height of the plurality of first support units 210 may further ensure the reliability of the package.

Further, considering the alignment error of the mask plate, the separation between the region for disposing the first support units and the region for disposing the second support units may be defined by the boundary of the cathode. In the case where the alignment error causes the boarder of the mask plate to deviate from the edge position of the cathode and shift away from the display region, the hollow region of the mask plate may expose the support units, such that the support units may not affect the hollow region that exceeds the edge of the preset pattern of the common film layer. In the case where the alignment error causes the boarder of the mask plate to deviate from the edge position of the cathode and shift towards the display region, the support units may be able to provide support for the frame of the mask plate that exceeds the edge of the preset pattern of the common film layer.

In one embodiment, the minimum straight-line distance from any first support unit 210 among the plurality of first support units 210 to the edge of the display region AA may be in a range of approximately 50 μm to 150 μm. The maximum straight-line distance from a first support unit 210 among the plurality of first support units 210 to the edge of the display region AA may be smaller than or equal to 250 μm.

Considering the evaporation result of the panel structure, the edge of the cathode formed by evaporation using the cathode mask plate may be located within the non-display region. In addition, when the distance from the edge of the cathode to the edge of the display region (here, the distance refers to the minimum straight-line distance from any point on the edge of the cathode to the edge of the display region) is approximately 300 μm, the evaporation result may be desired. Further, considering that the alignment error of the mask plate is about 50 μm, in the case where the alignment error causes the boarder of the mask plate to deviate from the edge position of the cathode and shift away from the display region, the hollow region of the mask plate may expose some of the second support units, but the second support units may not affect the hollow region that exceeds the edge of the preset pattern of the common film layer; in the case where the alignment error causes the boarder of the mask plate to deviate from the edge position of the cathode and shift towards the display region, when the plurality of first support units are disposed in the region corresponding to the exceeded boarder of the mask plate, the cathode mask plate supported by the plurality of second support units may be affected by the first support units because the height of the first support units is larger than the height of the second support units. As such, collision, friction, and tilting of the mask plate may take place. Therefore, in one embodiment, the maximum straight-line distance from any first support unit 210 to the edge of the display region AA may be smaller than or equal to 250 μm.

Also, considering that the alignment error of the mask plate is 50 μm, in the case where the alignment error causes the boarder of the mask plate to deviate from the edge position of the cathode and shift away from the display region, the hollow region of the mask plate may expose the support units, such that the support units may not affect the hollow region that exceeds the edge of the preset pattern of the common film layer. In the case where the alignment error causes the boarder of the mask plate to deviate from the edge position of the cathode and shift towards the display region, the support units may be able to provide support for the frame of the mask plate that exceeds the edge of the preset pattern of the common film layer. In one embodiment, a minimum straight-line distance from any second support unit 220 among the plurality of second support units 220 to the edge of the display region AA may be in a range of approximately 250 μm to 350 μm.

Figure 11:
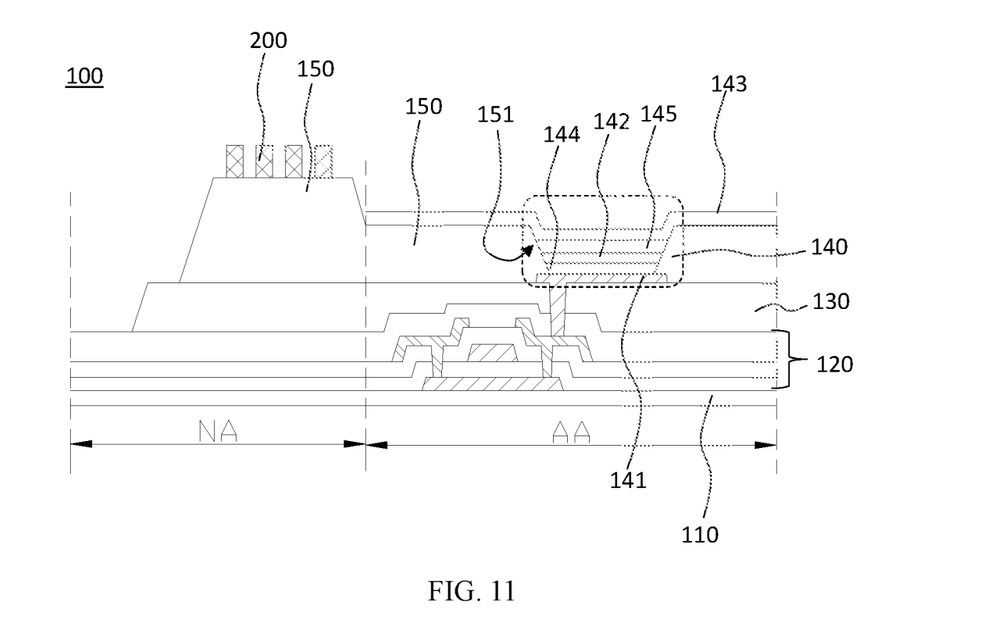
FIG. 11 illustrates another exemplary schematic cross-sectional view of the organic light-emitting display panel shown in FIG. 3 in the direction along the B-B line.

FIG. 11 illustrates another exemplary schematic cross-sectional view of the organic light-emitting display panel shown in FIG. 3 in the direction along the B-B line. Referring to FIG. 11, in the direction perpendicular to the substrate 110, the thickness of the plurality of island structures 152 may be larger than the thickness of the pixel defining layer 150 in the display region AA.

In one embodiment, the island structures and the pixel defining layer in the display region that has a thickness different from the thickness of the island structures may be formed by controlling the degree of etching using a halftone mask plate. In other embodiments of the present disclosure, the above structures may also be completed through a single etching process.

In one embodiment, the support units need to be in contact with the mask plate. When the mask plate is pressed on the display panel or shifts with respect to the display panel, the mask plate may cause a certain degree of impact on the support units. Therefore, the supports unit may need to be made of a material with certain flexibility. Moreover, to ensure that friction between the mask plate and other film layers of the display panel can be avoided, a certain height may be required for the support units. That is, the plurality of support units may be required to have a certain height. In one embodiment, by setting the thickness of the island structures larger than the thickness of the pixel defining layer in the display region, the height of the support units can be raised by the island structures. Therefore, for support units that have desired buffering performance but can be easily deformed, the height of the support units may be appropriately reduced due to the assistance of the island structures. As such, bending or deformation of the support units under the friction of the mask plate due to the excessively high support units may be avoided, which may further prevent the scratching of the existing film layers, and thus the product yield may be improved.

Figure 12:
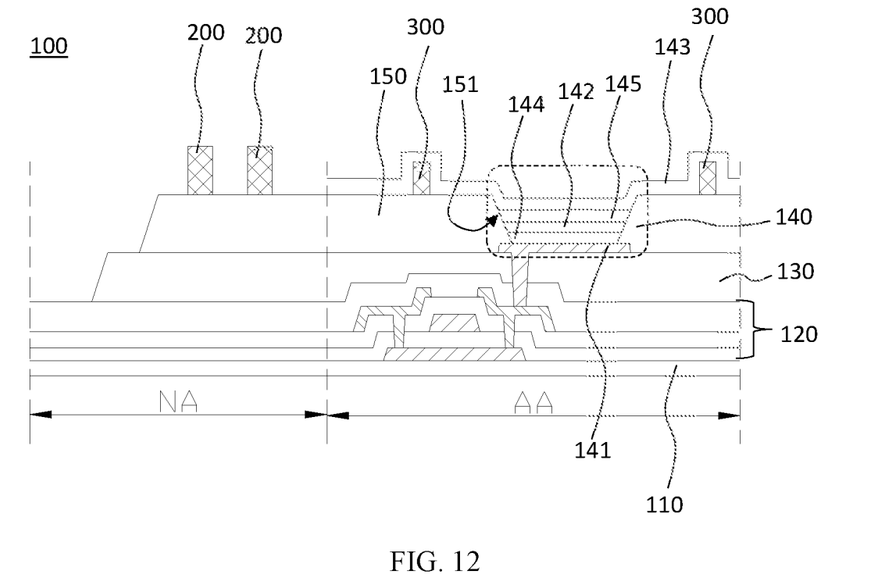
FIG. 12 illustrates another exemplary schematic cross-sectional view of the organic light-emitting display panel shown in FIG. 3 in the direction along the B-B line.

FIG. 12 illustrates another exemplary schematic cross-sectional view of the organic light-emitting display panel shown in FIG. 3 in the direction along the B-B line. Referring to FIG. 12, in one embodiment, the organic light-emitting display panel may further include a plurality of main support pillars 300 disposed in the display region AA. The plurality of main support pillars 300 may be formed on the surface of the pixel defining layer 150 away from the substrate 110. In the direction perpendicular to the substrate 110, the height of the plurality of support units 200 may be smaller than the height of the plurality of main support pillars 300.

In one embodiment, the plurality of support units 200 and the plurality of main support units 300 may be made of the same material and in the same layer. For example, the plurality of support units 200 and the plurality of main support pillars 300 that have different thicknesses (i.e., heights) may be formed by controlling the degree of etching using a halftone mask plate. In other embodiments of the present disclosure, the above structures may also be completed through a single etching process.

According to the disclosed organic light-emitting display panels, the process can be simplified, and the introduction of a new film layer can be avoided, which may be conducive to making the display panel thinner. Moreover, even when an alignment error of the mask plate takes place and a portion of the frame of the mask plate exceeds the edge of the display region and enters the display region, collision or friction between the film layers in the display region and the mask plate may still be avoided by properly matching the plurality of support units and the plurality of main support pillars.

In other embodiments of the present disclosure, the plurality of main support pillars may include a plurality of first main pillars disposed close to the edge of the display region, and a plurality of second main pillars disposed on the side of the plurality of first main pillars that is away from the edge of the display region. The height of the plurality of first main pillars may be smaller than the height of the plurality of second main pillars. Moreover, the height of the plurality of support units may be larger than the height of the plurality of first main pillars, and the height of the plurality of support units may be smaller than the height of the plurality of second main pillars. In one embodiment, the minimum straight-line distance from any second main pillar to the edge of the display region may be larger than 50 μm.

According to the disclosed organic light-emitting display panel, the plurality of first main pillars may ensure that even when an alignment error of the mask plate takes place and a portion of the frame of the mask plate exceeds the edge of the display region and enters the display region, collision or friction between the film layers in the display region and the mask plate can still be avoided by properly matching the plurality of support units and the plurality of main support pillars. In addition, the plurality of second main pillars may be able to provide the display region reliable and effective support, the plurality of support units may be able to reduce or avoid the scratching of the display panel, and the support units on the edge of the display region may not be able to affect the package.

FIGS. 13-16 illustrate schematic views of structures at certain stages of an exemplary fabrication method according to some embodiments of the present disclosure. Using the exemplary fabrication method, at least an organic light-emitting display panel may be formed. The steps and materials that have been described in the present disclosure and the steps that are the same as those in the existing technology are not described herein again.

Figure 13:
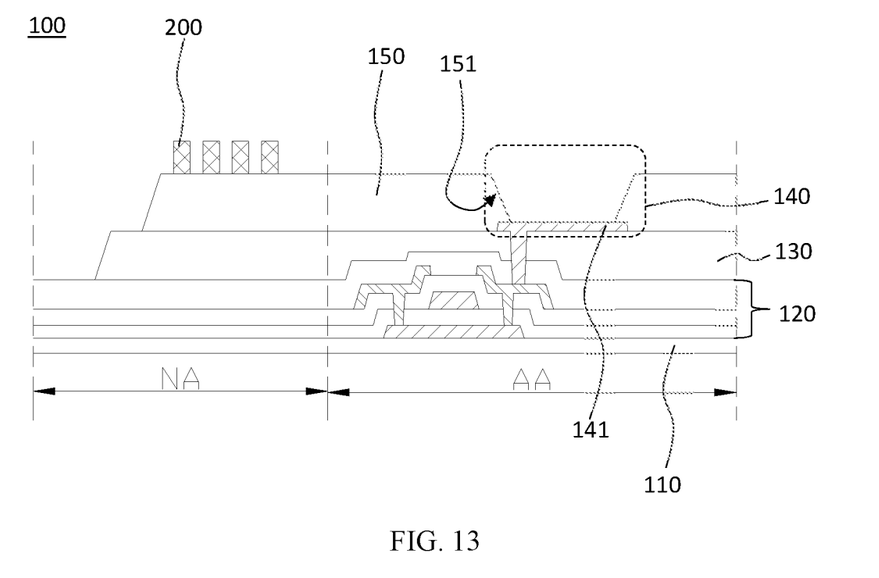
FIGS. 13-16 illustrate schematic views of structures at certain stages of an exemplary method for fabricating an organic light-emitting display panel according to some embodiments of the present disclosure.

Referring to FIG. 13, the fabrication method may include providing a substrate 110 including a display region AA and a non-display region NA, forming an array layer 120 on a first side surface of the substrate 110, and forming a pixel defining layer on the surface of the array layer 120 away from the substrate 110 and forming a plurality of organic light-emitting devices 140 in the display region AA.

In one embodiment, each organic light-emitting device 140 may be an organic light-emitting diode.

It should be noted that the organic light-emitting display panel may be divided into a display region and a non-display region surrounding to the display region. Although during the fabrication process, the display region of the display panel has not been formed, arrangement for the positions of the display region and the non-display region may have been completed. For example, according to the embodiments of the present disclosure, the substrate may be divided into two parts corresponding to the display region and the non-display region, respectively, and the film layers may be accordingly disposed in subsequent processes.

In one embodiment, forming the pixel defining layer 150 on the surface of the array layer 120 away from the substrate 110 and also forming a plurality of organic light-emitting devices 140 in the display region AA may include sequentially forming an anode 143, a pixel defining layer 150, an organic light-emitting layer 142, and a cathode 143 on the array layer 120 along a direction away from the substrate 110.

For example, the anode 141 may be first formed on the array layer 120. Forming the anode 141 may include forming a first metal layer on the array layer 120, and patterning the first metal layer to form a plurality of metal patterns. In one embodiment, the plurality of metal patterns and the plurality of pixels may have one-to-one correspondence. Forming the pixel defining layer 150 on the anode 141 may include forming an insulating layer on the array layer 120 and the anode 141 (optionally, the insulating layer may be an organic insulating layer). The insulating layer may be patterned through a wet etching, dry etching, or photolithography process to form a plurality of openings 151 exposing the anode 141. The plurality of openings 151 and the plurality of pixels may have one-to-one correspondence.

In one embodiment, after forming the pixel defining layer 150 and prior to forming the organic light-emitting layer 142, the fabrication method may further include forming a plurality of support units 200 on the surface of the pixel defining layer 150 away from the substrate 110. The plurality of support units 200 may be disposed in the non-display region NA.

In one embodiment, the plurality of support units 200 may be made of an organic material. The plurality of support units 200 may be formed by patterning through wet etching, dry etching, or photolithography.

Figure 14:
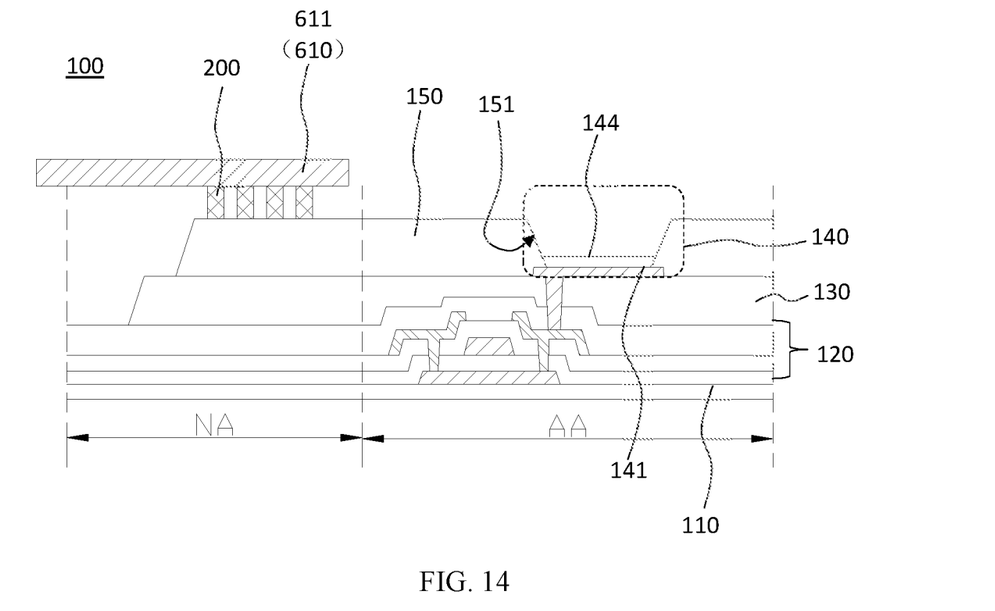

Referring to FIG. 14, in one embodiment, after fabricating the plurality of support units 200 and prior to forming the organic light-emitting layer 142, a hole transport layer 144 may be formed on the surface of the pixel defining layer 150 away from the substrate 110. For example, forming the hole transport layer may include the following exemplary steps. First, a first common mask plate 610 may be provided. The first common mask plate 610 may include a first hollow region exposing the display region AA, and a first frame region 611 surrounding the first hollow region. Then, the first common mask plate 610 may be aligned with the organic light-emitting display panel 100. The first frame region 611 may be in contact with the plurality of support units 200. Further, the hole transport layer 144 may be formed in the display region AA by evaporating through the first common mask plate 610.

Figure 15:
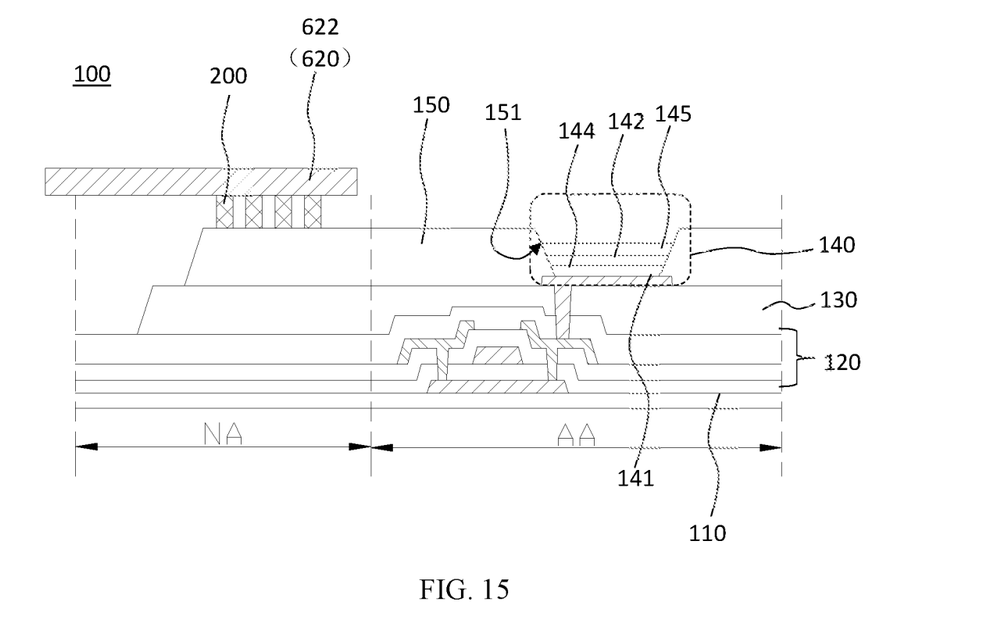

Referring to FIG. 15, an organic light-emitting layer 142 may be formed on the pixel defining layer 150. The organic light-emitting layer 142 may be formed in each opening 151 using an inkjet printing or nozzle printing method.

In one embodiment, after forming the organic light-emitting layer 142, and prior to forming the cathode 143, the fabrication method may also include forming an electron transport layer 145 on the side surface of the organic light-emitting layer 142 away from the substrate 110. For example, forming the electron transport layer 145 may include the following exemplary steps. First, a second common mask plate 620 may be provided. The second common mask plate 620 may include a second hollow region exposing the display region AA, and a second frame region 622 surrounding the second hollow region. Then, the second common mask plate 620 may be aligned with the organic light-emitting display panel 100. The second frame region 622 may be in contact with the plurality of support units 200. Further, the electron transport layer 145 may be formed in the display region AA by evaporating through the second common mask plate 620.

Figure 16:
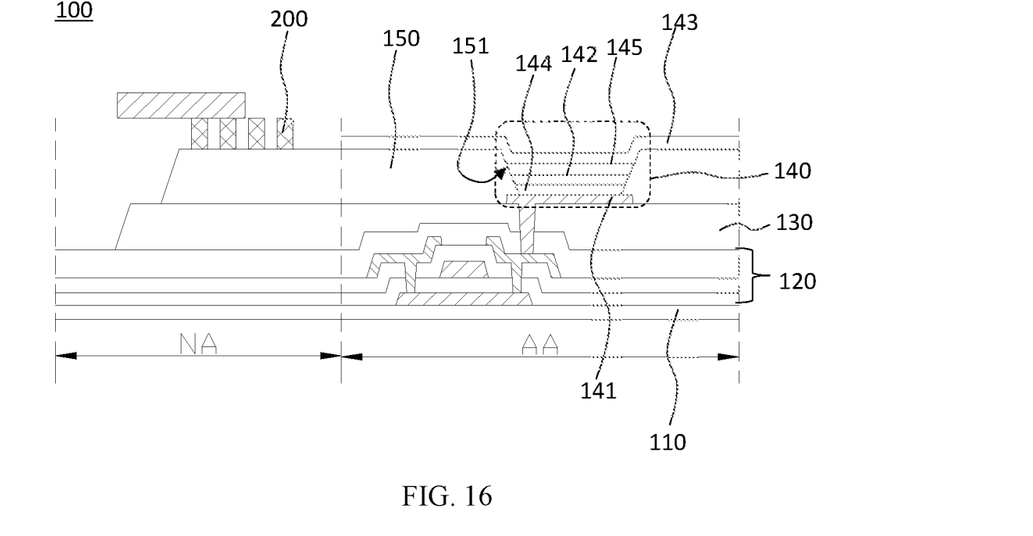

Further, referring to FIG. 16, a cathode 143 may be formed on the organic light-emitting layer 142. The cathode 143 may be formed on the organic light-emitting layer 142 through an evaporation method. In one embodiment, the cathode 143 may have a single-piece structure and may cover the organic light-emitting layer 142, the pixel defining layer 150, and the array layer 120.

Further, in one embodiment, a thin-film packaging layer (not shown) may be formed on the organic light-emitting devices 140 (i.e., the light-emitting functional layer).

According to the fabrication method for the organic light-emitting display panel, scratching of the display panel by the mask plate may be reduced, the process difficult may be reduced, and the product yield may be improved.

Figure 17:
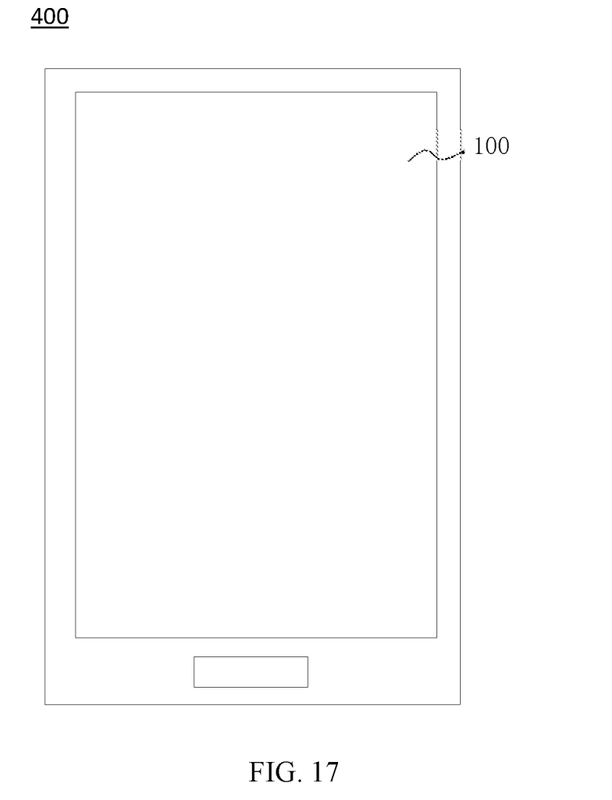
FIG. 17 illustrates a schematic structural view of an exemplary display device according to some embodiments of the present disclosure.

Further, the present disclosure also provides a display device. FIG. 17 illustrates a schematic structural view of an exemplary display device according to some embodiments of the present disclosure. Referring to FIG. 17, the display device 400 may include a display panel consistent with various embodiments of the present disclosure, and a shell protecting the display panel. The display device may include various OLED display devices, such as mobile phones, televisions, tablet computers, smart watches, electronic papers, vehicle display terminals, etc.

In one embodiment, the display device 400 may be a flexible display device, a curved display device, or a foldable display device.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. An organic light-emitting display panel, divided into a display region and a non-display region surrounding the display region, and comprising:
   a substrate;
   an array layer formed over the substrate;
   a pixel defining layer formed on a surface of the array layer away from the substrate;
   a plurality of organic light-emitting devices formed in a plurality of openings of the pixel defining layer, wherein the plurality of organic light-emitting devices are disposed in the display region, and each organic light-emitting device includes an anode, an organic light-emitting layer, and a cathode sequentially formed on the substrate in a direction away from the substrate;

a plurality of support units disposed in the non-display region, wherein at least one support unit of the plurality of support units is disposed on a surface of the pixel defining layer away from the substrate, wherein:

in the non-display region, the pixel defining layer includes a plurality of island structures isolated from each other, and at least one support unit of the support units is disposed on the plurality of island structures.

2. The organic light-emitting display panel according to claim 1, wherein:

a quantity of the plurality of support units is smaller than a quantity of the plurality of island structures.

3. The organic light-emitting display panel according to claim 1, further including:

an auxiliary conductive layer disposed in the non-display region, wherein the auxiliary conductive layer is in a same layer as the anode, and the cathode is in contact with the anode through a spacing between the plurality of island structures.

4. The organic light-emitting display panel according to claim 1, wherein:

in a direction perpendicular to the substrate, a thickness of the plurality of island structures is larger than a thickness of the pixel defining layer in the display region.

5. The organic light-emitting display panel according to claim 1, wherein:

a minimum straight-line distance from a support unit, among the plurality of support units, to an edge of the display region is in a range of approximately 50 μm to 150 μm.

6. A display device, comprising the organic light-emitting display panel according to claim 1.

7. An organic light-emitting display panel, divided into a display region and a non-display region surrounding the display region, and comprising:

a substrate;

an array layer formed over the substrate;

a pixel defining layer formed on a surface of the array layer away from the substrate;

a plurality of organic light-emitting devices formed in a plurality of openings of the pixel defining layer, wherein the plurality of organic light-emitting devices are disposed in the display region, and each organic light-emitting device includes an anode, an organic light-emitting layer, and a cathode sequentially formed on the substrate in a direction away from the substrate;

a plurality of support units disposed in the non-display region, wherein at least one support unit of the plurality of support units is disposed on a surface of the pixel defining layer away from the substrate, wherein:

the plurality of support units include a plurality of first support units located within a region covered by an orthogonal projection of the cathode on the substrate, and a plurality of second support units located outside the region covered by the orthogonal projection of the cathode on the substrate.

8. The organic light-emitting display panel according to claim 7, wherein:

a minimum straight-line distance from a second support unit, among the plurality of second support units, to an edge of the display region is in a range of approximately 50 μm to 150 μm;

a maximum straight-line distance from a second support unit, among the plurality of second support units, to the edge of the display region is smaller than or equal to 250 μm; and a minimum straight-line distance from a first support unit, among the plurality of first support units, to the edge of the display region is in a range of approximately 250 μm to 350 μm.

9. The organic light-emitting display panel according to claim 7, wherein:

in a direction perpendicular to the substrate, a height of the plurality of first support units is larger than a height of the plurality of second support units.

10. The organic light-emitting display panel according to claim 7, further including:

a plurality of main support pillars disposed in the display region and on the surface of the pixel defining layer away from the substrate, wherein:

in a direction perpendicular to the substrate, a height of the plurality of support units is smaller than a height of the plurality of main support pillars.

11. The organic light-emitting display panel according to claim 7, further including:

a retaining wall disposed in the non-display region, wherein:

the retaining wall is formed on a surface of the array layer away from the substrate and surrounds the display region; and at least one support unit of the plurality of support units is formed on a surface of the retaining wall away from the substrate.

12. The organic light-emitting display panel according to claim 7, wherein:

the plurality of support units include a plurality of third support units and a plurality of fourth support units, wherein a height of the plurality of third support units is larger than a height of the plurality of fourth support units.

13. The organic light-emitting display panel according to claim 12, wherein:

the plurality of third support units and the plurality of fourth support units are alternately arranged along a linear path from an edge of the display region to an edge of the organic light-emitting display panel.

14. The organic light-emitting display panel according to claim 1, further including a packaging layer formed to fully cover the plurality of organic light-emitting devices.

* * * * *